(12) United States Patent
Chinthakindi et al.

(10) Patent No.: US 7,691,717 B2
(45) Date of Patent: Apr. 6, 2010

(54) POLYSILICON CONTAINING RESISTOR WITH ENHANCED SHEET RESISTANCE PRECISION AND METHOD FOR FABRICATION THEREOF

(75) Inventors: Anil K. Chinthakindi, Wappingers Falls, NY (US); Douglas D. Coolbaugh, Highland, NY (US); Ebenezer E. Eshun, Newburgh, NY (US); John E. Florkey, Centerville, OH (US); Robert M. Rassel, Colchester, VT (US); Kunal Vaed, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 27 days.

(21) Appl. No.: 11/458,494

(22) Filed: Jul. 19, 2006

(65) Prior Publication Data

US 2008/0122574 A1 May 29, 2008

(51) Int. Cl.
*H01L 21/20* (2006.01)
(52) U.S. Cl. .............. 438/382; 438/383; 438/384; 257/380; 257/516; 257/E27.035; 257/E27.025; 257/E27.047
(58) Field of Classification Search ......... 438/382–385; 257/380, 516, 581, E27.035, E27.025, E27.047, 257/E21.004
See application file for complete search history.

(56) References Cited

U.S. PATENT DOCUMENTS

| | | | |
|---|---|---|---|
| 4,489,104 A | 12/1984 | Lee | |
| 6,242,314 B1 * | 6/2001 | Chen et al. | 438/384 |
| 6,291,306 B1 * | 9/2001 | Hsu et al. | 438/385 |
| 6,717,233 B1 | 4/2004 | Haddad et al. | |
| 6,730,554 B1 | 5/2004 | Baldwin et al. | |
| 6,885,280 B2 | 4/2005 | Olson | |
| 2006/0121684 A1 * | 6/2006 | Chen | 438/385 |
| 2006/0166454 A1 * | 7/2006 | Coolbaugh et al. | 438/381 |
| 2006/0166457 A1 * | 7/2006 | Liu et al. | 438/400 |
| 2007/0194390 A1 * | 8/2007 | Chinthakindi et al. | 257/379 |

FOREIGN PATENT DOCUMENTS

| | | |
|---|---|---|
| CN | 1196136 A | 10/1998 |
| CN | 1156004 C | 6/2004 |

* cited by examiner

*Primary Examiner*—Hsien-ming Lee
(74) *Attorney, Agent, or Firm*—Scully, Scott, Murphy & Presser, P.C.; Joseph P. Abate, Esq.

(57) ABSTRACT

A polysilicon containing resistor includes: (1) a p dopant selected from the group consisting of boron and boron difluoride; and (2) an n dopant selected from the group consisting of arsenic and phosphorus. Each of the p dopant and the n dopant has a dopant concentration from about 1e18 to about 1e21 dopant atoms per cubic centimeter. A method for forming the polysilicon resistor uses corresponding implant doses from about 1e14 to about 1e16 dopant ions per square centimeter. The p dopant and the n dopant may be provided simultaneously or sequentially. The method provides certain polysilicon resistors with a sheet resistance percentage standard deviation of less than about 1.5%, for a polysilicon resistor having a sheet resistance from about 100 to about 5000 ohms per square.

9 Claims, 3 Drawing Sheets

| BORON DOSE 10KeV | ARSENIC OR PHOSPHORUS DOSE | MEAN | STD DEV | %STD DEV |
|---|---|---|---|---|
| 0 | 4.40E+15-P | 317.6833 | 9.9365 | 3.13% |
| 7.00E+15 | 0 | 260.72 | 4.42 | 1.70% |
| 4.00E+15 | 0 | 256.955 | 4.739044 | 1.84% |
| 1.00E+15 | 0 | 746.0155 | 19.40691 | 2.60% |
| 4.00E+15 | 1.00E+15 P | 533.2243 | 6.584754 | 1.23% |
| 7.00E+15 | 3.00E45 As | 955.47 | 25.96 | 2.92% |

POLYSILICON CONTAINING RESISTOR WITH ENHANCED SHEET RESISTANCE PRECISION AND METHOD FOR FABRICATION THEREOF

BACKGROUND

1. Field of the Invention

The invention relates generally to resistors within semiconductor structures. More particularly, the invention relates to polysilicon containing resistors within semiconductor structures.

2. Description of the Related Art

In addition to transistors, diodes and capacitors, semiconductor structures and semiconductor circuits routinely also incorporate resistors. Resistors may be used within semiconductor circuits as signal processing components and power dissipative components, as well as resistive load components.

Although resistors are common components within semiconductor circuits, resistors, like other semiconductor circuit components, are desirably fabricated with enhanced performance at decreased dimensions. Within the context of resistor fabrication, enhanced performance is often manifested within the context of a bulk resistivity precision or a sheet resistance precision of a resistor, since bulk resistivity precision or sheet resistance precision is often of importance to circuit performance.

Resistors within semiconductor circuits may be fabricated using any of several resistive materials. However, a particularly common resistive material is a polysilicon containing resistive material. Polysilicon containing resistive materials may be fabricated with different bulk resistivities or sheet resistances, while incorporating different levels and types of dopants. The dopants may be intrinsically incorporated when depositing a polysilicon material. In the alternative, such dopants are commonly ion implanted when forming polysilicon resistors.

Various methods have been disclosed in the semiconductor fabrication art for forming polysilicon resistors.

For example, Lee, in U.S. Pat. No. 4,489,104 teaches a polysilicon resistor that may be formed using a sequential co-doping method. Within this prior art reference, the polysilicon resistor that is formed using the sequential co-doping method has an inhibited lateral diffusion.

In addition, Chen et al., in U.S. Pat. No. 6,242,314, teaches a concurrent co-doping method that may be used to form a polysilicon resistor. Within this prior art reference, the polysilicon resistor that is formed using the concurrent co-doping method may be used as a temperature controller.

As semiconductor technology continues to advance and semiconductor device dimensions continue to decrease, needs continue to exist for fabricating semiconductor devices, such as polysilicon containing resistors, with enhanced performance. In particular, needs continue to exist for fabricating polysilicon containing resistors with enhanced resistivity precision or sheet resistance precision.

SUMMARY OF THE INVENTION

The invention provides a polysilicon containing resistor structure and a method for fabricating the polysilicon containing resistor structure. The polysilicon containing resistor structure and the method for fabricating the polysilicon containing resistor use: (1) at least one of a boron dopant and a boron difluoride dopant; and (2) at least one of a phosphorus dopant and an arsenic dopant, within a specific concentration range (for the polysilicon containing resistor) and a specific dose range (for the method for fabricating the polysilicon containing resistor). Within the context of: (1): at least one of the boron dopant and the boron difluoride dopant; and (2) only a phosphorus dopant (and not necessarily an arsenic dopant), the polysilicon containing resistor has a comparatively low (i.e., less than about 1.5%) percentage standard deviation of a sheet resistance. This low percentage standard deviation signifies that a precision resistor is formed.

A polysilicon resistor structure in accordance with the invention includes a polysilicon containing layer located over a substrate. The polysilicon containing layer includes: (1) at least one p dopant selected from the group consisting of a boron dopant and a boron difluoride dopant in a total p dopant concentration from about 1e18 to about 1e21 dopant atoms per cubic centimeter; and (2) at least one n dopant selected from the group consisting of a phosphorus dopant and an arsenic dopant in a total n dopant concentration from about 1e18 to about 1e21 dopant atoms per cubic centimeter. The polysilicon resistor structure provides that the total p dopant concentration and the total n dopant concentration differ in concentration by at least about 1e19 dopant atoms per cubic centimeter.

A method in accordance with the invention includes implanting into a polysilicon containing layer located over a substrate at least one p dopant selected from the group consisting of a boron dopant and a boron difluoride dopant at a total p dopant dose from about 1 e14 to about 1e16 dopant ions per square centimeter. The method also includes implanting into a polysilicon containing layer located over a substrate at least one n dopant selected from the group consisting of a phosphorus dopant and an arsenic dopant at a total n dopant dose from about 1e14 to about 1e16 dopant ions per square centimeter. The method also includes annealing the polysilicon containing layer to activate the p dopant and the n dopant.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENTS

The invention, which includes a polysilicon containing resistor and a method for fabricating the polysilicon containing resistor, is described in further detail below, and understood within the context of the descriptions of the drawings described above. Since the drawings are intended for illustrative purposes, they are not necessarily drawn to scale.

Reference is first made to FIG. 1 to FIG. 8 which show a series of schematic cross-sectional diagrams illustrating the results of progressive stages in fabricating a polysilicon containing resistor in accordance with preferred embodiments of the invention.

Figure 1:
FIG. 1 to FIG. 8 show a series of schematic cross-sectional diagrams illustrating the results of progressive stages in fabricating a semiconductor structure, including a polysilicon containing resistor, in accordance with preferred embodiments of the invention.

FIG. 1 shows a schematic cross-sectional diagram of the polysilicon containing resistor at an early stage in the fabrication thereof in accordance with the embodiments. Specifically, FIG. 1 shows a semiconductor substrate 10 including an isolation region 12 that is located within an isolation trench (illustrated by implication) within the semiconductor substrate 10. A polysilicon containing layer 14 is located upon the isolation region 12.

Each of the foregoing semiconductor substrate 10, isolation region 12 and polysilicon containing layer 14 may comprise materials and have dimensions that are conventional in the semiconductor fabrication art. Each of the foregoing semiconductor substrate 10, isolation region 12 and polysilicon containing layer 14 may be formed using methods that are conventional in the semiconductor fabrication art.

The semiconductor substrate 10 comprises a semiconductor material. Non-limiting examples of semiconductor materials include silicon, germanium, silicon-germanium alloy, silicon carbide, silicon-germanium carbide alloy and compound semiconductor materials. Non-limiting examples of compound semiconductor materials include gallium arsenide, indium arsenide and indium phosphide semiconductor materials.

The semiconductor substrate 10 may comprise a bulk semiconductor substrate. Alternatively, the semiconductor substrate 10 may comprise a semiconductor-on-insulator substrate. A semiconductor-on-insulator substrate comprises a base semiconductor substrate, a buried dielectric layer located thereupon and a surface semiconductor layer located further thereupon. Finally, the semiconductor substrate 10 may comprise a hybrid orientation substrate. A hybrid orientation substrate comprises multiple semiconductor regions of different crystallographic orientations.

Semiconductor-on-insulator substrates and hybrid orientation substrates may be formed using methods including but not limited to: laminating methods, layer transfer methods and separation by implantation of oxygen (SIMOX) methods.

The isolation region 12 comprises an isolation material. Isolation materials are typically dielectric isolation materials. Such dielectric isolation materials may include, but are not limited to: oxides, nitrides and oxynitrides of silicon. Oxides, nitrides and oxynitrides of other elements are not excluded. The dielectric isolation materials may be crystalline or amorphous dielectric isolation materials. The dielectric isolation materials may be formed using methods including, but not limited to: thermal or plasma oxidation or nitridation methods, chemical vapor deposition methods and physical vapor deposition methods. Typically, the isolation region 12 comprises at least in part a silicon oxide dielectric isolation material formed to a thickness that fills the isolation trench. Typically, such a thickness is from about 2000 to about 6000 angstroms. It is understood by a person skilled in the art that such an isolation layer is not a prerequisite to the implementation of this invention and the subsequent polysilicon layer 14 may be located and deposited directly on the semiconductor substrate 10.

The polySi-containing layer 14 comprises a polysilicon material. Polysilicon containing materials are intended to include purely polysilicon materials, as well as polysilicon materials that include concentrations of other elements such as germanium, thus providing, for example, polysilicon-germanium alloy materials. The polysilicon containing material may be formed using any of several methods. Included are chemical vapor deposition methods and physical vapor deposition methods. Chemical vapor deposition methods are particularly common for forming the polysilicon containing material that comprises the polysilicon containing layer 14. Typically, the polysilicon containing layer 14 comprises an undoped polysilicon containing material that has a thickness from about 200 to about 5000 angstroms, more particularly greater than about 1000 angstroms to about 2500 angstroms.

Figure 2:
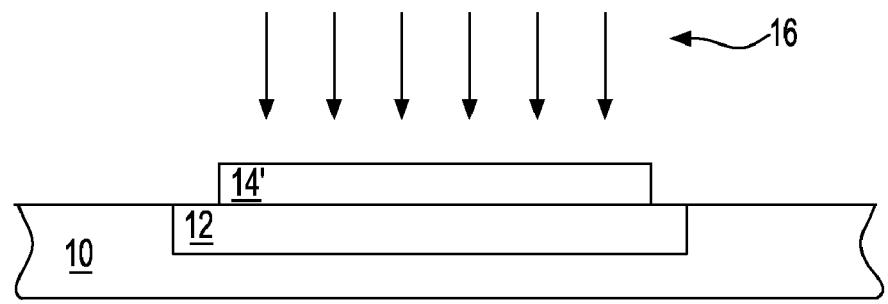

FIG. 2 shows the results of further processing of the semiconductor structure of FIG. 1. Specifically, FIG. 2 shows a dose of first dopant ions 16 that is implanted into the polysilicon containing layer 14 to provide the polysilicon containing layer 14'. The dose of first dopant ions 16 comprises one of a p dopant ion and an n dopant ion. The p dopant includes at least one dopant selected from the group consisting of boron dopant ions and boron difluoride dopant ions. The n dopant includes at least one dopant selected from the group consisting of phosphorus dopant ions and arsenic dopant ions. The dose of first dopant ions 16 is preferably provided at a dose of 1e14 to about 1e16 dopant ions per square centimeter (more preferably from about 1e15 to about 1e16 dopant ions per square centimeter for boron and/or boron difluoride or about 5e14 to about 5e15 dopant ions per square centimeter for phosphorus and/or arsenic). The foregoing dose equates to a total p or n dopant concentration from about 1e18 to about 1e21 dopant atoms per cubic centimeter within the polysilicon layer 14'. Typically, an ion implantation energy from about 1 to about 100 KeV is used.

Figure 3:
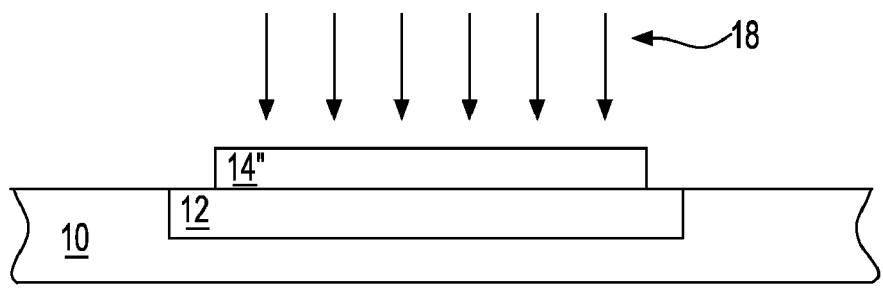

FIG. 3 shows the results of further processing of the semiconductor structure of FIG. 2. Specifically, FIG. 3 shows a dose of second dopant ions 18 that is implanted into the polysilicon layer 14' to provide the polysilicon layer 14". The dose of the second dopant ions 18 comprises the other of the foregoing p dopant ions and the foregoing n dopant ions, in accordance with the instant embodiment. The dose of second dopant ions 18 is typically also provided at a dose of 1e14 to about 1e16 dopant ions per square centimeter, which also equates to a concentration from about 1e18 to about 1e21 second dopant atoms per cubic centimeter within the polysilicon containing layer 14". More preferred ranges are also the same as disclosed above for the first dopant ions 16.

Within the embodiments and the invention the dose of first dopant ions 16 and the dose of second dopant ions 18 yield a difference in concentration of at least about 1e19 dopant atoms per cubic centimeter, and a difference in dose of at least about 5e14 dopant ions per square centimeter.

The above cited differences in dose of the first dopant ions 16 and second dopant ions 18, and resulting concentration differences, are intended within the context of the instant embodiments to provide a sheet resistance, after annealing of the polysilicon containing layer 14", in a range from about 100 to about 5000 ohms per square. As will be illustrated within the context of further description and experimental data below, use of the foregoing concentration ranges and complementary ion implantations also provides a comparatively low (i.e., less than about 1.5%) percentage standard deviation of a sheet resistance for a particular polysilicon containing resistor fabricated in accordance with the invention.

Figure 4:
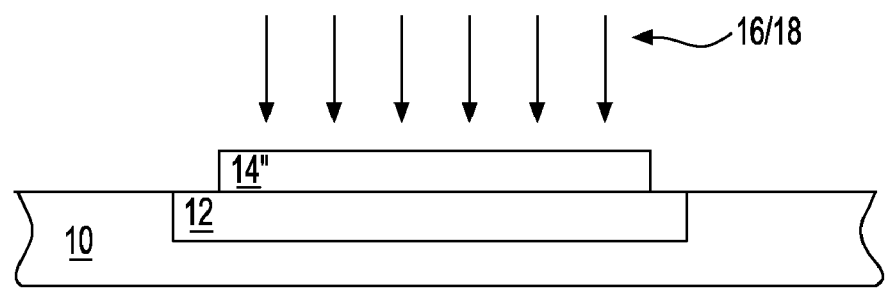

FIG. 4 shows an alternate embodiment (in comparison with the process sequence of FIG. 2 and FIG. 3) that also yields a semiconductor structure identical to the semiconductor structure of FIG. 3. Specifically, FIG. 4 illustrates a simultaneous co-doping with the doses of first dopant ions 16 and second dopant ions 18 to yield the polysilicon containing layer 14". The co-doping using the dose of first dopant ions 16 and the dose of second dopant ions 18 that is illustrated within FIG. 4 is undertaken using the same individual parameters that are used for the individual first dopant ions 16 step in FIG. 2 and second dopant ions 18 step in FIG. 3.

Figure 5:
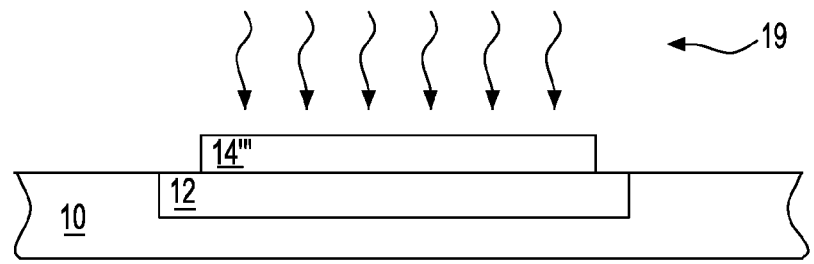

FIG. 5 shows the results of thermally annealing the semiconductor structure of FIG. 4 within a thermal annealing environment 19 to form the polysilicon resistor 14'''. The thermal annealing may be undertaken using any of several methods. Included are more conventional thermal annealing methods such as furnace annealing methods. Also included are thermal annealing methods that are undertaken on a shorter timescale, generally on the order of milliseconds. These shorter timescale thermal annealing methods include rapid thermal anneal, flash anneal, spike anneal and laser anneal methods. At least the last three of the foregoing four methods also use an optical illumination and irradiation rather than a purely thermal annealing and irradiation. Typically, the semiconductor structure of FIG. 4 is thermally annealed to provide the semiconductor structure of FIG. 5 while using any of the standard thermal annealing methods known in art, including but not limited to furnace annealing, rapid thermal annealing or laser annealing.

Figure 6:
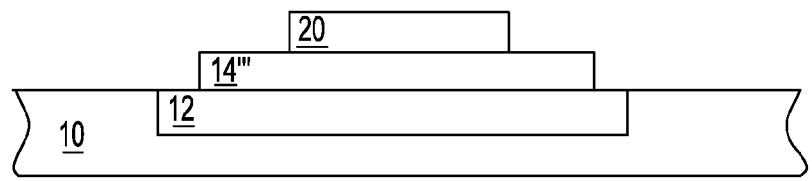

FIG. 6 shows the results of forming a silicide blocking layer 20 nominally centered upon the polysilicon resistor 14'''. The silicide blocking layer 20 may be formed of any of several materials formed using any of several deposition methods. Non-limiting examples of materials include oxides, nitrides and oxynitrides of silicon, although oxides, nitrides and oxynitrides of other elements are not excluded. Non-limiting examples of deposition methods include chemical vapor deposition methods and physical vapor deposition methods. Chemical vapor deposition methods are particularly common. As is illustrated within the schematic cross-sectional diagram of FIG. 4, the silicide blocking layer 20 leaves exposed end portions of the polysilicon resistor 14'''. Typically, the silicide blocking layer 20 has a thickness from about 10 to about 500 angstroms.

Figure 7:
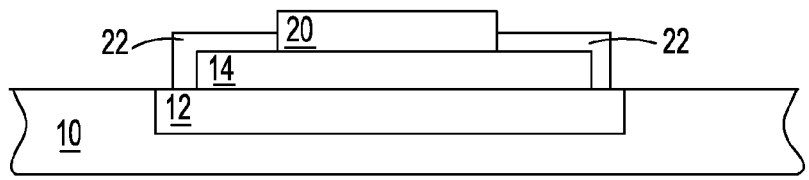

FIG. 7 shows silicide layers 22 located and formed upon exposed portions of the polysilicon resistor 14'''. Silicide layers 22 may be formed from any of several silicide forming metals. Non-limiting examples include titanium, tungsten, platinum, cobalt and nickel silicide forming metals. The silicide forming metals may be deposited using methods including, but not limited to: chemical vapor deposition methods and physical vapor deposition methods (such as sputtering methods). Physical vapor deposition methods are particularly common. Typically, the silicide layers 22 are formed using a self-aligned silicide method (i.e., a salicide method) that includes a blanket silicide forming metal layer deposition, a thermal annealing and an excess unreacted silicide forming metal layer strip. Other methods for forming the silicide 22 layers are not excluded. Typically, the silicide layers 22 have a thickness from about 100 to about 200 angstroms.

Figure 8:
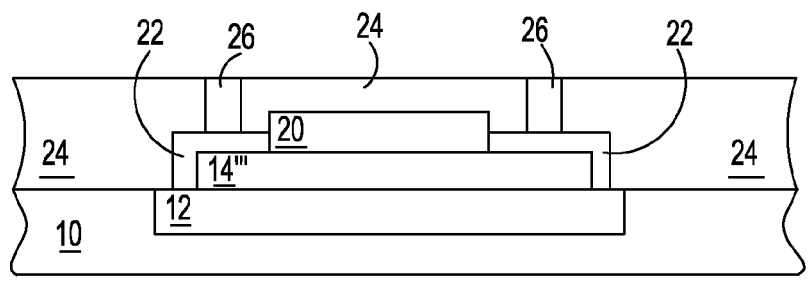

FIG. 8 first shows passivation layers 24 located covering the semiconductor structure of FIG. 7. Passivation layers 24 comprise dielectric passivation materials. Dielectric passivation materials may include, but are not limited to: oxides, nitrides and oxynitrides of silicon. Oxides, nitrides and oxynitrides of other elements are not excluded. The passivation layers 24 may be formed using any of several methods. Included are chemical vapor deposition methods and physical vapor deposition methods. Chemical vapor deposition methods are particularly common. Typically, the passivation layers 24 have a thickness from about 500 to about 10000 angstroms over the silicide blocking layer 20.

FIG. 8 also shows contact layers 26. Contact layers 26 penetrate through the passivation layers 24 to contact silicide layers 22. Thus, contact layers 26 provide opposite end contact to polysilicon resistor 14'''. Contact layers 26 may comprise any of several conductor contact materials. Non-limiting examples include certain metals, metal alloys, metal nitrides and metal silicides. The conductor contact materials may be formed using methods including, but not limited to: plating methods, chemical vapor deposition methods and physical vapor deposition methods. Typically, the contact layers 26 comprise a copper, aluminum or tungsten conductor contact material, along with a suitable barrier material. Non-limiting examples of suitable barrier materials generally include nitride materials, but the invention is not so limited.

FIG. 8 shows a schematic cross-sectional diagram of a semiconductor structure in accordance with the embodiments of the invention. The semiconductor structure comprises a polysilicon containing resistor 14''' connected at both ends using contact layers 26 and silicide layers 22. As will be seen within the context of additional experimental data that follows, the polysilicon containing resistor 14''' has an enhanced sheet resistance precision (i.e., a reduced sheet resistance percentage standard deviation of less than about 1.5%) that results from a multiple ion implantation of dopants of opposite polarity within the context of the above disclosure.

Figures 9, 10:
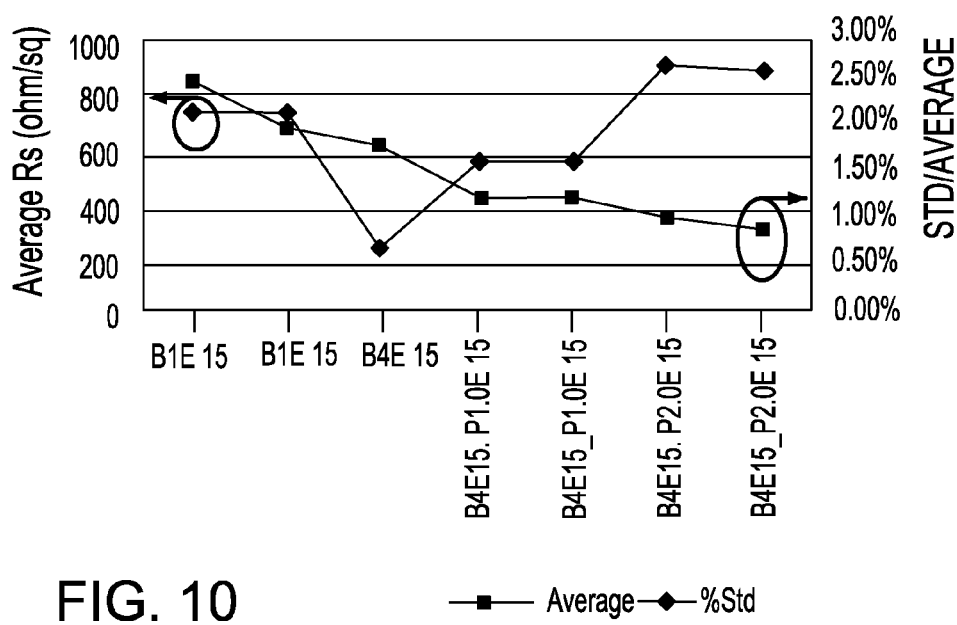
FIG. 9 shows a chart listing, among other data, sheet resistance percentage standard deviations for polysilicon containing resistors formed in accordance with the invention.
FIG. 10 shows a graph including additional sheet resistance percentage standard deviation data for polysilicon containing resistors formed in accordance with the invention.

FIG. 9 shows a chart illustrating mean values, standard deviation values and percentage standard deviation values for boron, and phosphorus or arsenic, dopant implants that may be used for forming polysilicon containing resistors in accordance with the ion implant processing scheme of FIG. 2 to FIG. 3, or alternatively in accordance with the ion implant processing scheme of FIG. 4. Shown in FIG. 9 is data for: (1) a phosphorus dopant implant alone at a dose of 4.4e15; (2) boron dopant implants alone at doses of 7e15, 4e15 and 1e15; (3) a boron dopant at a dose of 4e15 in conjunction with a phosphorus dopant at 1e15; and (4) a boron dopant at a dose of 7e15 in conjunction with an arsenic dopant at 3e15 (all units are dopant ions per square centimeter). Ion implantation processes were undertaken into a polysilicon layer of thickness about 1000 to 2000 angstroms. Rapid thermal annealing was then used for dopant activation. Attention in particular is drawn to data for the boron dopant in conjunction with the phosphorus dopant, which has a particularly low percentage standard deviation per unit average value of sheet resistance at 1.23%.

Mean values are calculated as simple arithmetic mean values. Standard deviations are calculated as the square root of the sum of the squares of deviations of individual data points from a mean value. Percentage standard deviations of mean values are calculated using the foregoing mean values and standard deviations thereof. The foregoing values are derived from 20 data points across a wafer.

FIG. 9 also shows results of a boron and arsenic co-dopant experiment that shows a percentage standard deviation of 2.72% for a polysilicon resistor. Additional experimentation may provide for optimization within claimed ranges.

The tabular data of FIG. 9 is further amplified by additional related graphical data of FIG. 10. FIG. 10 shows sheet resistance values for polysilicon resistors formed using boron dopants alone at 1e15 and 4e15 boron dopant atoms per square centimeter dose. FIG. 10 also shows a boron dopant at a dose of 4e15 in conjunction with a phosphorus dose of either 1e15 or 2e15 dopant ions per square centimeter. As is illustrated within the graph of FIG. 9, the boron and phosphorus co-doped examples have a sheet resistance percentage standard deviation of less than 1.5%, and a sheet resistance in a range from about 500 to about 1000 ohms per square. The invention is typically applicable for a sheet resistance in a range from about 100 to about 5000 ohms per square.

The tabular data of FIG. 9 and the graphical data of FIG. 10 clearly illustrate that a polysilicon containing resistor in accordance with the embodiments and the invention that uses multiple ion implants of opposite conductivity type using boron and phosphorus dopants provide the polysilicon containing resistor with a comparatively low sheet resistance percentage standard deviation of less than about 1.5 percent. Such a comparatively low sheet resistance percentage standard deviation is desirable when fabricating integrated circuits since such a comparatively low sheet resistance percentage standard deviation provides for enhanced semiconductor circuit performance.

The preferred embodiments of the invention are illustrative of the invention rather than limiting of the invention. Revisions and modifications may be made to methods, materials, structures and dimensions of a polysilicon resistor in accordance with the preferred embodiments of the invention while still providing a polysilicon resistor in accordance with the invention, further in accordance with the accompanying claims.

What is claimed is:

1. A method for fabricating a resistor comprising:
   implanting into a polysilicon containing layer located over a substrate:
      at least one p dopant selected from the group consisting of a boron dopant and a boron difluoride dopant at a total p dopant dose from about 1e14 to about 1e16 dopant ions per square centimeter; and
      at least one n dopant consisting of a phosphorus dopant at a total n dopant dose from about 1e14 to about 1e16 dopant ions per square centimeter; and
   annealing the polysilicon containing layer to activate the p dopant and the n dopant wherein the implanting and the annealing provide the polysilicon containing layer with a sheet resistance from about 100 to about 5000 ohms per square, and a sheet resistance percentage standard deviation less than about 1.5%.

2. The method of claim 1 wherein a difference between the total p dopant dose and total n dopant dose is at least about 5e14 dopant ions per square centimeter.

3. The method of claim 1 wherein the implanting of the p dopant and the n dopant is undertaken sequentially.

4. The method of claim 1 wherein the implanting of the p dopant and the n dopant is undertaken simultaneously.

5. The method of claim 1 wherein the annealing is undertaken using a furnace annealing method.

6. The method of claim 1 wherein the annealing is undertaken using a rapid thermal annealing method.

7. The method of claim 1 wherein the annealing is undertaken using a laser annealing method.

8. The method of claim 1 wherein the implanting uses a polysilicon containing layer having a thickness from about 200 angstroms to about 5000 angstroms.

9. The method of claim 1 wherein:
   the at least one p dopant is provided at a dose of 4E15 dopant atoms per square centimeter; and
   the at least one n dopant is provided at a dose from 1E15 to 2E15 dopant atoms per square centimeter.

* * * * *